(12) United States Patent
Yokoi

(10) Patent No.: US 7,660,148 B2
(45) Date of Patent: Feb. 9, 2010

(54) NONVOLATILE MEMORY DEVICE AND METHOD TO CONTROL THE SAME

(75) Inventor: Atsushi Yokoi, Seto (JP)

(73) Assignee: Spansion LLC, Sunnyvale, CA (US)

( * ) Notice: Subject to any disclaimer, the term of this patent is extended or adjusted under 35 U.S.C. 154(b) by 115 days.

(21) Appl. No.: 12/060,710

(22) Filed: Apr. 1, 2008

(65) Prior Publication Data
US 2008/0266934 A1    Oct. 30, 2008

(30) Foreign Application Priority Data
Apr. 24, 2007    (JP)    ............... 2007-114488

(51) Int. Cl.
*G11C 11/00*    (2006.01)
(52) U.S. Cl. .................. 365/148; 365/158; 365/171
(58) Field of Classification Search ............ 365/66, 365/100, 148, 158, 171
See application file for complete search history.

(56) References Cited

U.S. PATENT DOCUMENTS

| 6,788,562 B2 * | 9/2004 | Nishizaka et al. ............. 365/63 |
| 6,831,872 B2 | 12/2004 | Matsuoka |
| 6,862,213 B2 | 3/2005 | Hamaguchi |
| 6,888,773 B2 | 5/2005 | Morimoto |
| 6,906,940 B1 | 6/2005 | Lue |
| 6,967,867 B2 | 11/2005 | Hamaguchi |
| 6,995,999 B2 | 2/2006 | Morimoto |
| 7,002,837 B2 | 2/2006 | Morimoto |
| 7,016,222 B2 | 3/2006 | Morikawa |
| 7,045,840 B2 | 5/2006 | Tamai et al. |
| 7,057,922 B2 | 6/2006 | Fukumoto |
| 7,208,751 B2 | 4/2007 | Ooishi |
| 7,433,222 B2 * | 10/2008 | Hosoi et al. ................ 365/148 |
| 7,542,326 B2 * | 6/2009 | Yoshimura et al. .......... 365/148 |

FOREIGN PATENT DOCUMENTS

JP    2004355670    12/2004

* cited by examiner

*Primary Examiner*—Gene N. Auduong (57) ABSTRACT

A nonvolatile memory device is disclosed. The nonvolatile memory device includes a source selector transistor connected at one end thereof to a source line, a plurality of cell selector transistors connected in series with each other and to the other end of said source selector transistor and a basic memory unit including a variable resistor element which is constituted as a memory element to store bit information and is provided for each of said cell selector transistors, being connected at one end thereof to the drain terminal of said cell selector transistor and connected at the other end thereof to the bit line. The source selector transistor and said cell selector transistor provided between one end of said variable resistor element to be accessed and said source line are controlled to turn on.

20 Claims, 8 Drawing Sheets

| TARGET BIT LINE | SS00 | WL0 | WL1 | WL2 | WL3 | WL4 | WL5 | WL6 |
|---|---|---|---|---|---|---|---|---|
| BL0 | H | H | L | L | L | L | L | L |
| BL1 | H | H | H | L | L | L | L | L |
| BL2 | H | H | H | H | L | L | L | L |
| BL3 | H | H | H | H | H | L | L | L |
| BL4 | H | H | H | H | H | H | L | L |
| BL5 | H | H | H | H | H | H | H | L |
| BL6 | H | H | H | H | H | H | H | H |

| TARGET BIT LINE | SSL0 | WL0 | WL1 | WL2 | SW1 | WL3 | WL4 | WL5 | SSR0 |
|---|---|---|---|---|---|---|---|---|---|
| BL0 | H | H | L | L | L | L | L | L | L |
| BL1 | H | H | H | L | L | L | L | L | L |
| BL2 | H | H | H | H | H | H | H | H | H |
| BL3 | H | H | H | H | H | H | H | H | H |
| BL4 | L | L | L | L | L | L | H | H | H |
| BL5 | L | L | L | L | L | L | L | H | H |

FIG. 8 (PRIOR ART)

NONVOLATILE MEMORY DEVICE AND METHOD TO CONTROL THE SAME

RELATED U.S. APPLICATION

This Application claims priority to Japanese Patent Application 2007-114488 entitled "Nonvolatile Memory Device and Method to Control the Same" filed Apr. 24, 2007 which is incorporated herein in its entirety.

TECHNICAL FIELD

The present invention relates to a nonvolatile memory device wherein bit information is stored in a variable resistor element of which resistance is changed by applying a voltage.

BACKGROUND

Figure 8:
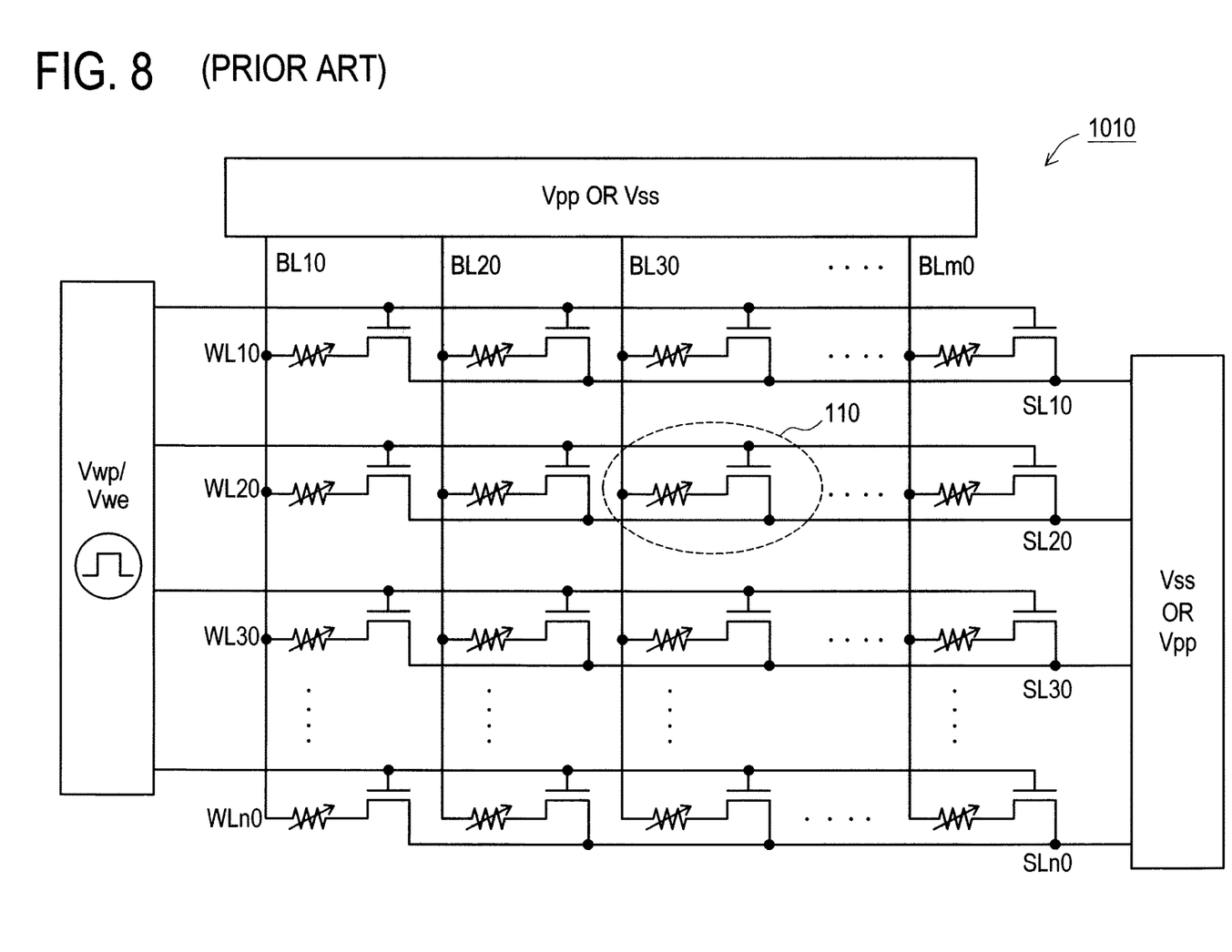
FIG. 8 is a circuit diagram showing the constitution of the memory array of the prior art.

A nonvolatile semiconductor memory device disclosed in Japanese Patent Publication No. 2005-25914 has such a constitution as a memory cell 110 is formed by connecting one end of a variable resistor element with the drain of a selector transistor, while a plurality of the memory cells are arranged in rows and columns to form a memory array 1010, as shown in FIG. 8. The plurality of memory cells disposed in one row are connected to a word line at the gate of the selector transistor, and the plurality of memory cells disposed in one column are connected to a bit line at the other end of the variable resistor element. The plurality of memory cells 110 disposed in one row or in one column are connected to a source line at the source of the selector transistor.

However, the prior art technology described above has such a constitution as the memory cell 110 formed by connecting the variable resistor element and the selector transistor is provided for each bit of information, while the word line, the bit line and the source line are connected to each memory cell 110.

In the prior art technology described above, the memory cell 110 is used as the basic unit, with a plurality of the memory cells 110 arranged in a matrix of rows and columns so as to form the memory array 1010. This constitution is well known in the field of randomly accessible storage devices such as DRAM or NOR type flash memory. A storage device having this constitution uses each memory cell as the basic unit, while the word line, the bit line and the source line are connected to each memory cell, thus resulting in restraint on the degree of integration with respect to the circuit layout.

For example, the circuit layout requires it to connect the variable resistor element that constitutes the memory cell 110 and the selector transistor by means of a contact layer and secure a contact region in accordance to the layout of the contact layer. In addition, it is necessary to secure a contact region for connecting the memory cell 110 to each of the word line, the bit line and the source line. This means that four contact regions must be provided for each of the memory cells 110. The four contact regions and the requirements imposed on the circuit layout by the constitution of the memory array 1010 may restrict the improvement in the degree of integration.

SUMMARY OF THE INVENTION

The present invention has been contrived to solve the problems of the prior art described above. An object of the present invention is to provide a constitution of a new memory array, which is different from the prior art constitutions such as that disclosed in the document cited above, for a nonvolatile memory device having variable resistor element as the memory element, and provide a novel method of accessing the memory.

In order to achieve the above object, there is provided a nonvolatile memory device comprising: a source selector transistor connected at one end thereof to a source line; a plurality of cell selector transistors connected in series with each other and to the other end of said source selector transistor; and a basic memory unit including a variable resistor element which is constituted as a memory element to store bit information and is provided for each of said cell selector transistors, being connected at one end thereof to the drain terminal of said cell selector transistor and connected at the other end thereof to the bit line, wherein said source selector transistor and said cell selector transistor provided between one end of said variable resistor element to be accessed and said source line are controlled to turn on (conduction state).

The nonvolatile memory device of the present invention comprises a basic memory unit. The basic memory unit has such a constitution as a variable resistor element, at least one cell selector transistor and a source selector transistor are connected in series in a path running from a bit line which is connected to other end of each variable resistor element to a source line. For the variable resistor element to be accessed, the cell selector transistor and the source selector transistor provided in the path running from one end of the variable resistor element to the source line are turned on so that the variable resistor element is biased with a voltage stress applied between the terminals thereof via the bit line and the source line. The voltage stress causes the resistance of the variable resistor element to change to store the bit information.

According to the invention, there is further provided a method for controlling a nonvolatile memory device comprising a source selector transistor connected at one end thereof to a source line, a plurality of cell selector transistors connected in series with each other and to the other end of said source selector transistor, and variable resistor element which is a memory element to store bit information provided for each of said cell selector transistors and is connected at one end thereof to the drain terminal of said cell selector transistor and connected at the other end thereof to the bit line, said method comprising the steps of: causing said source selector transistor and said cell selector transistor, which are provided between one end of said variable resistor element to be accessed and said source line, to turn on (conduction state); and biasing a voltage stress between said bit line, to which said variable resistor element to be accessed and said source line is connected, and said source line.

According to the method of controlling the nonvolatile memory device of the present invention, the variable resistor element, at least one cell selector transistor and the source selector transistor are connected in series in the path running from the bit line which is connected to the other end of each variable resistor element to the source line, while for the variable resistor element to be accessed, the cell selector transistor and the source selector transistor provided in the path running from one end of the variable resistor element to the source line are turned on so that the variable resistor element is biased with a voltage stress applied between the terminals thereof via the bit line and the source line. The voltage stress causes the resistance of the variable resistor element to change so as to store the bit information.

This causes each variable resistor element to be connected on the other end thereof to a different bit line, and connected at one end thereof to the drain terminal of the corresponding cell selector transistor among the plurality of cell selector transistors which are connected in series, and connected to the source line via at least one cell selector transistor and the source selector transistor. The variable resistor element is connected to the source line via the cell selector transistor provided in correspondence to the variable resistor element, the cell selector transistor provided in correspondence to the variable resistor element which is provided in parallel to the path running toward the source line and the source selector transistor.

In the prior art, it has been necessary to secure the contact region for connecting the variable resistor element and the cell selector transistor, and the contact region for connecting the cell selector transistor and the source line, for each memory cell. According to the present invention, in contrast, the contact region used for connecting the variable resistor element and the cell selector transistor also serves as the contact region for connecting the cell selector transistors with each other, and the variable resistor element is connected to the source line via the contact region. As a result, it is not necessary to specifically provide the contact region for connecting the cell selector transistor and the source line, thus reducing the area occupied by the device in the circuit.

One end of each variable resistor element is connected to the source line via at least one cell selector transistor and the source selector transistor, so as to allow access to the bit information through the bit line connected to the other end. In this case, while the number of the cell selector transistors connected between the variable resistor element and the source line varies depending on the position where the variable resistor element is connected, the cell selector transistor and the source selector transistor provided in the path are turned on when the variable resistor element to be accessed is connected to the source line, and therefore impedance of the path running from the variable resistor element to the source line can be set to a low value. Any of the variable resistor elements can be individually accessed, and the impedance of the path from the variable resistor element to the source line can be maintained at a low value regardless of the position of the variable resistor element. Substantially the same accessibility can be achieved among the variable resistor elements, so that the memory cell structure preferable for random access can be provided.

According to the present invention, random access to the variable resistor element, which is the memory element, is made possible while improving the degree of integration with respect to the circuit layout of the memory array, by constituting the nonvolatile memory device comprising the variable resistor elements in the form of memory array of novel constitution different from the prior art.

DETAILED DESCRIPTION OF THE INVENTION

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

EXEMPLARY EMBODIMENTS OF A NONVOLATILE MEMORY DEVICE AND METHOD TO CONTROL THE SAME

Exemplary embodiments of the nonvolatile memory device and the method to control the nonvolatile memory device according to the present invention will now be described in detail with reference to FIG. 1 through FIG. 7.

First Exemplary Embodiment

Figure 1:
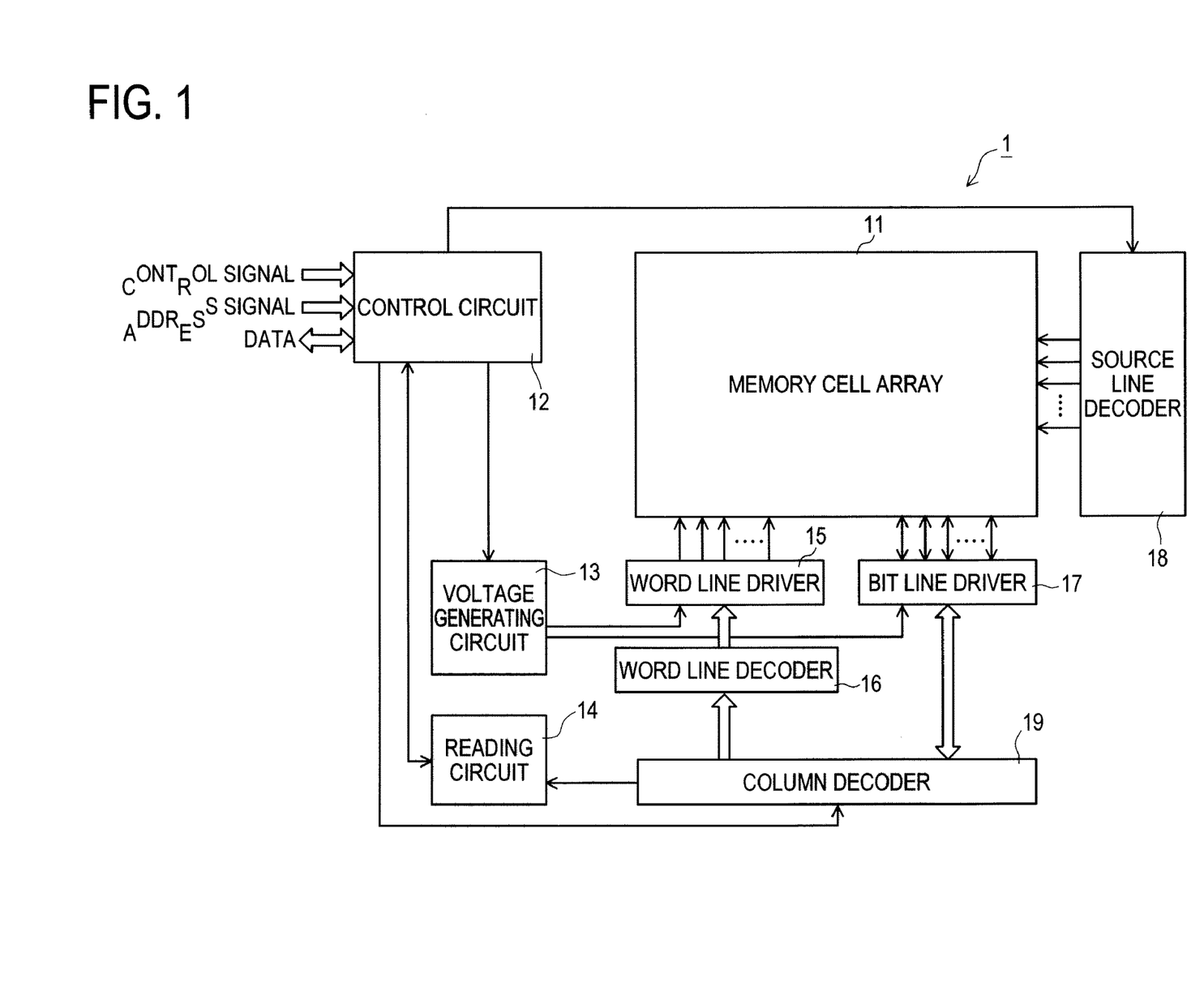
FIG. 1 is a functional block diagram showing the constitution of a semiconductor memory device according to a first embodiment.

FIG. 1 is a functional block diagram showing the nonvolatile memory device 1 of a first exemplary embodiment. The nonvolatile memory device 1 comprises a memory cell array 11, a control circuit 12, a voltage generating circuit 13, a reading circuit 14, a word line driver 15, a word line decoder 16, a bit line driver 17, a source line decoder 18 and a column decoder 19.

The control circuit 12 receives inputs of control signal, address signal and data, and controls the voltage generating circuit 13, the reading circuit 14 and the source line decoder 18. The voltage generating circuit 13 supplies the word line driver 15 and the bit line driver 17 with a voltage which varies depending on whether data is to be written in, deleted or read from the memory cell. When data is to be written or deleted in the memory cell, the column decoder outputs the data to be written or deleted to the bit line driver and, when data is to be read from the memory cell, the column decoder outputs the data which has been read to the reading circuit 14.

The word line decoder 16 selects a word line which corresponds to the address sent from the column decoder 19. The bit line driver 17 selects a bit line which corresponds to the address sent from the column decoder 19. The source line decoder 18 selects a source line which corresponds to the address of the control circuit 12.

Figure 2:
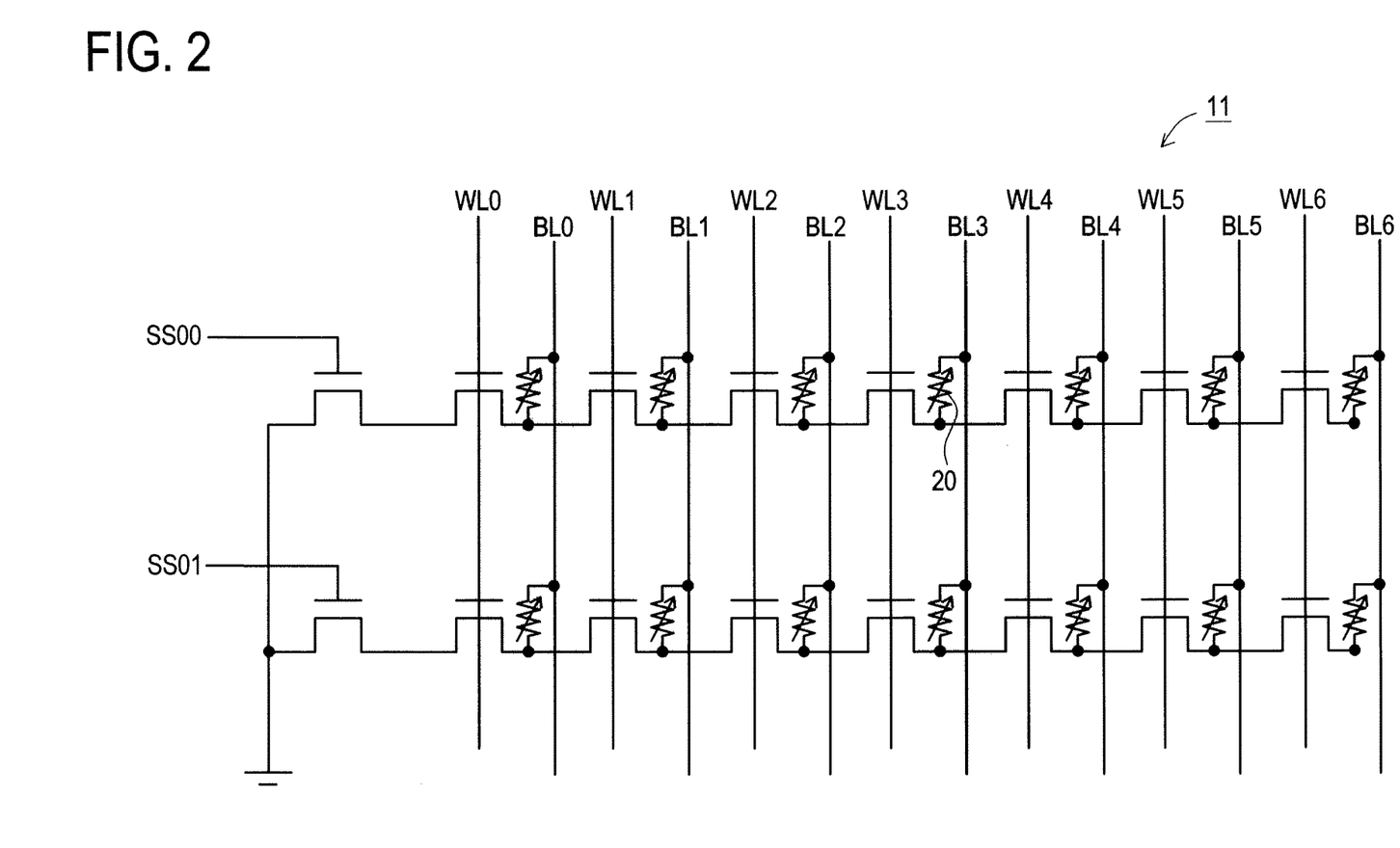
FIG. 2 is a circuit diagram showing the constitution of a memory cell array according to a first embodiment.

FIG. 2 is a circuit diagram showing the constitution of the memory cell array 11. The memory cell array 11 comprises the source selector transistor connected at one end thereof to source selector signal lines SS00 and SS01, a plurality of cell selector transistors connected in series with each other and to the other end of the source selector transistor, and the variable resistor element which is provided as the memory element for storing bit information for each cell selector transistor and is connected at one end thereof to the drain terminal of the cell selector transistor and connected at the other end to bit lines BL0 through BL6. The source selector transistor and the cell selector transistor connected between one end of the variable resistor element to be accessed and the source selector signal line SS00 or SS01 are put into continuity.

The word lines WL0 through WL6 and the bit lines BL0 through BL6 which are connected to the gate terminals of the cell selector transistors are disposed to run parallel to each other. As a result, the word lines WL0 through WL6 are disposed at predetermined pitch with a wiring interval permitted by the manufacturing process. In case the word lines WL0 through WL6 and the bit lines BL0 through BL6 are formed in different wiring layers, the restriction on the interval between the wiring lines can be mitigated or eliminated, so that the word lines and the bit lines can partially or entirely overlap each other in plan view, thus reducing the area required for wiring.

Figure 3:
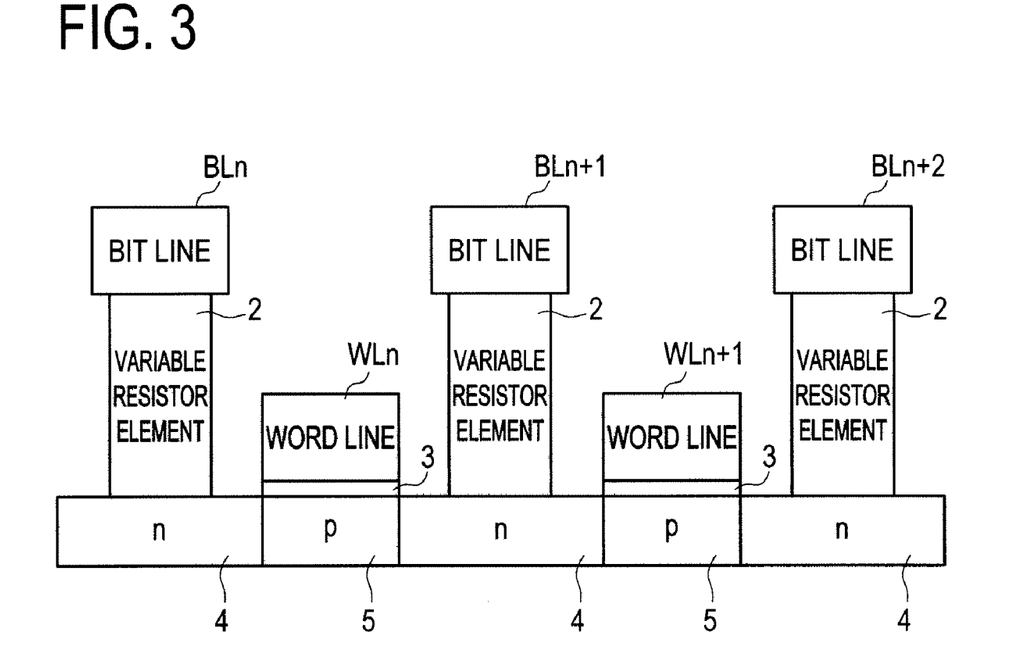
FIG. 3 is a sectional side view of a memory cell array according to a first embodiment.

FIG. 3 is a sectional view side view of the memory cell array of FIG. 2. Disposed below the word lines WLn and WLn+1 is a p-channel region 5 formed via a gate oxide film 3, and cell selector transistor is formed from N-type TFT. Disposed below the bit lines BLn through BLn+2 is an n-channel region 4 formed via the variable resistor element 2 formed from MIM (Metal Insulator Metal). The memory cell of the present invention requires only two contact regions for each memory cell, in contrast to the prior art in which four contact regions are required. As a result, the degree of integration in the circuit layout of the memory cell can be increased.

Figure 4:
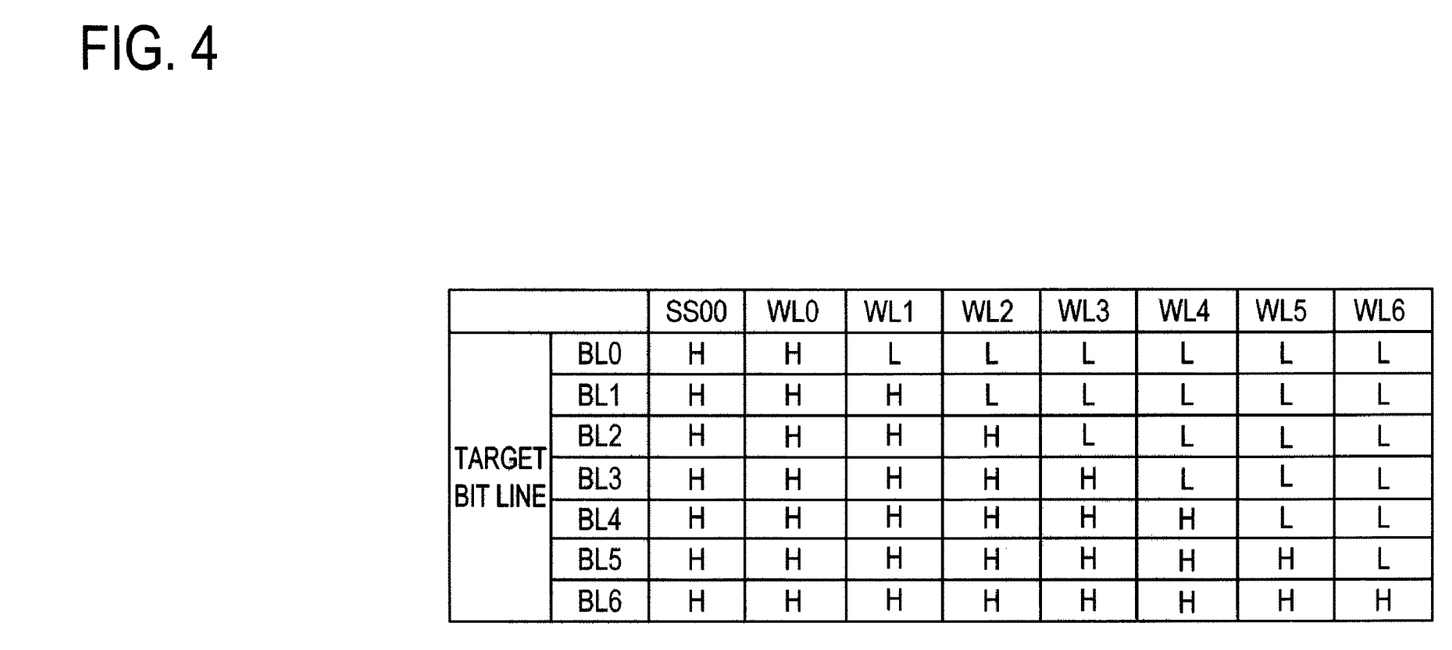
FIG. 4 is a table showing the states of the source selector signal line SS00 and the word lines WL0 through WL6 during access to the bit lines BL0 through BL7 according to one embodiment.

Operation of writing, deleting or reading data in or from the variable resistor element 20 (FIG. 2) will now be described. FIG. 4 shows a table of the states of the source selector signal line SS00 and the word lines WL0 through WL6 during access to the bit lines BL0 through BL6. When writing data to the variable resistor element 20, the control circuit 12 which has received the write command causes the column decoder to select a particular bit line according to the address signal which has been input. At this time, other bit lines which are not selected are put in floating state. In addition, a signal is sent to the word line decoder for selecting a particular word line, so that the word line decoder selects a particular word line according to the signal. Specifically, the word lines WL0 through WL3 are selected in order to select the variable resistor element 20. The voltage generating circuit 13 applies a positive write voltage to the word line driver 15 and the bit line driver 17, so as to raise the word lines WL0 through WL3 which are selected to high level and apply the predetermined write voltage to the bit line BL3. In addition, the source line decoder 18 raises the source selector signal line SS00 which is selected to high level according to the address signal which has been input, pulls the drain of the source selector transistor down to the ground potential, puts the source selector signal line SS01 which is not selected to low level and brings the drain of the source selector transistor which is not selected to floating state.

When deleting data stored in the variable resistor element 20, the control circuit 12 which has received the delete command causes the column decoder 19 and the word line decoder 16 to select the bit line 3 and the word lines WL0 through WL3 according to the address signal which has been input, similarly to the writing operation. The voltage generating circuit 13 applies a positive delete voltage to the word line driver 15, a negative delete voltage to the bit line driver 17 and a delete voltage to the bit line BL3 which is selected. In addition, the source line decoder 18 raises the source selector signal line SS00 which is selected to high level according to the address signal which has been input, pulls the drain of the source selector transistor down to the ground potential, puts the source selector signal line SS01 which is not selected to low level and brings the drain of the source selector transistor which is not selected to floating state.

When reading data stored in the variable resistor element 20, the control circuit 12 which has received the read command causes the column decoder to select the bit line BL3 according to the address signal which has been input. In addition, a high-level signal is sent to the word line driver 15 so as to select the word lines WL0 through WL3, and the word line driver 15 selects the word lines WL0 through WL3 according to the signal. The voltage generating circuit 13 applies a read voltage to the bit line driver 17, and the bit line driver 17 pre-charges read voltage to the bit line BL3 which is selected. The voltage generating circuit 13 also applies the read voltage to the word line driver 15. In addition, the source line decoder 18 raises the source selector signal line SS00 which is selected to high level according to the address signal which has been input, pulls the drain of the source selector transistor down to the ground potential, puts the source selector signal line SS01 which is not selected to low level and brings the drain of the source selector transistor which is not selected to floating state.

As described above in detail, the memory cell of the semiconductor memory device 1 according to the first embodiment requires only two contact regions for each memory cell, in contrast to four contact regions required in the prior art. As a result, the degree of integration in the circuit layout of the memory cell can be increased.

Second Exemplary Embodiment

Figure 5:
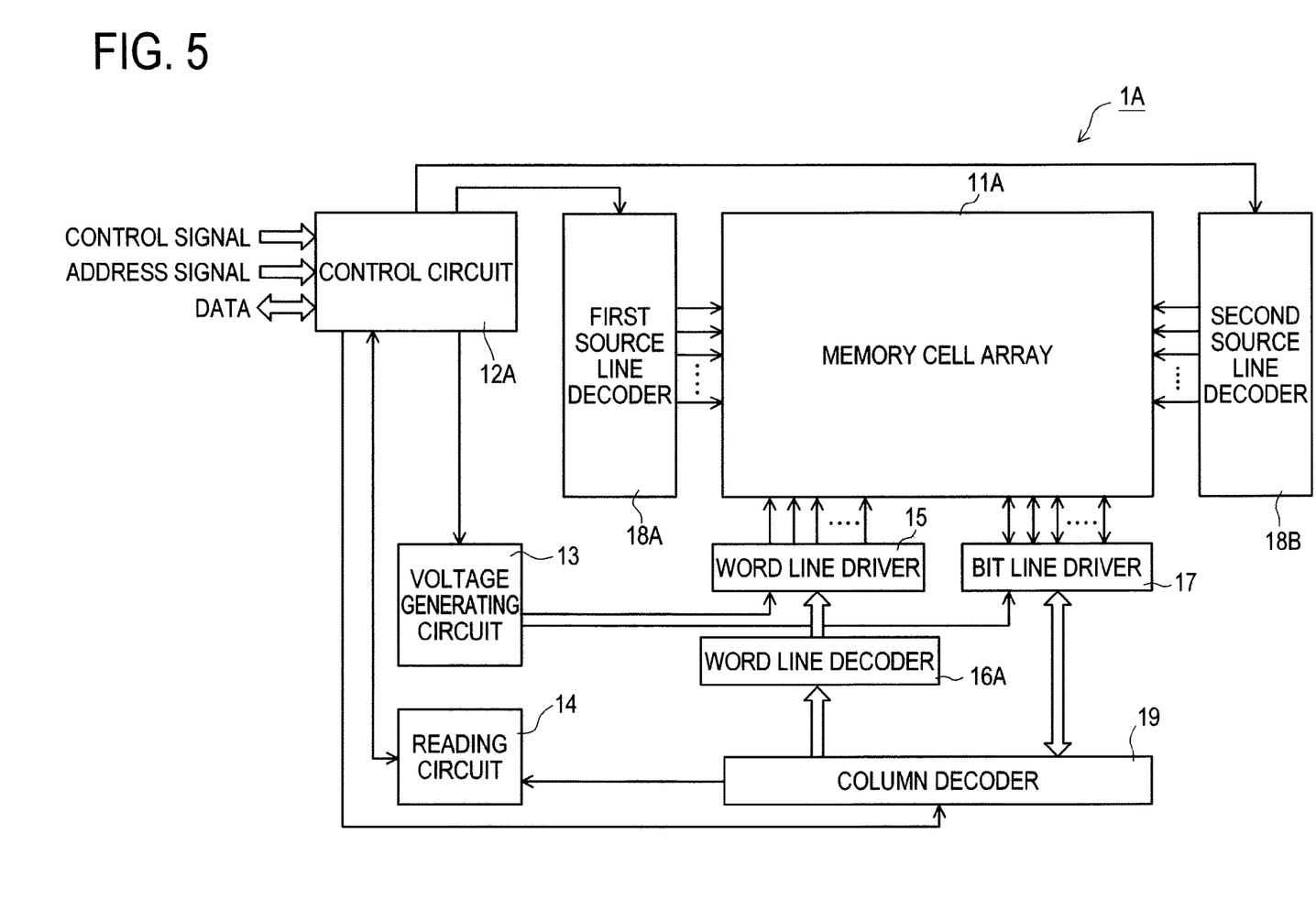
FIG. 5 is a functional block diagram showing the constitution of the semiconductor memory device according to a second embodiment.

FIG. 5 is a functional block diagram showing the constitution of a semiconductor memory device 1A according to the second exemplary embodiment. The semiconductor memory device 1A comprises a memory cell array 11A, a control circuit 12A, the voltage generating circuit 13, the reading circuit 14, the word line driver 15, a word line decoder 16A, the bit line driver 17, a first source line decoder 18A, a second source line decoder 18B and the column decoder 19.

The control circuit 12A receives inputs of control signal, address signal and data, and controls the voltage generating circuit 13, the reading circuit 14, the first source line decoder 18A and the second source line decoder 18B. The voltage generating circuit 13 supplies the word line driver 15 and the bit line driver 17 with a voltage which varies depending on whether data is to be written in, deleted or read from the memory cell. When data is to be written or deleted in the memory cell, the column decoder outputs the data to be written or deleted to the bit line driver and, when data is to be read from the memory cell, the column decoder outputs the data which has been read to the reading circuit 14.

The word line decoder 16 selects a word line which corresponds to the address sent from the column decoder 19. The bit line driver 17 selects a bit line which corresponds to the address sent from the column decoder 19. The first source line decoder 18A and the second source line decoder 18B select a source line which corresponds to the address of the control circuit 12A.

Figure 6:
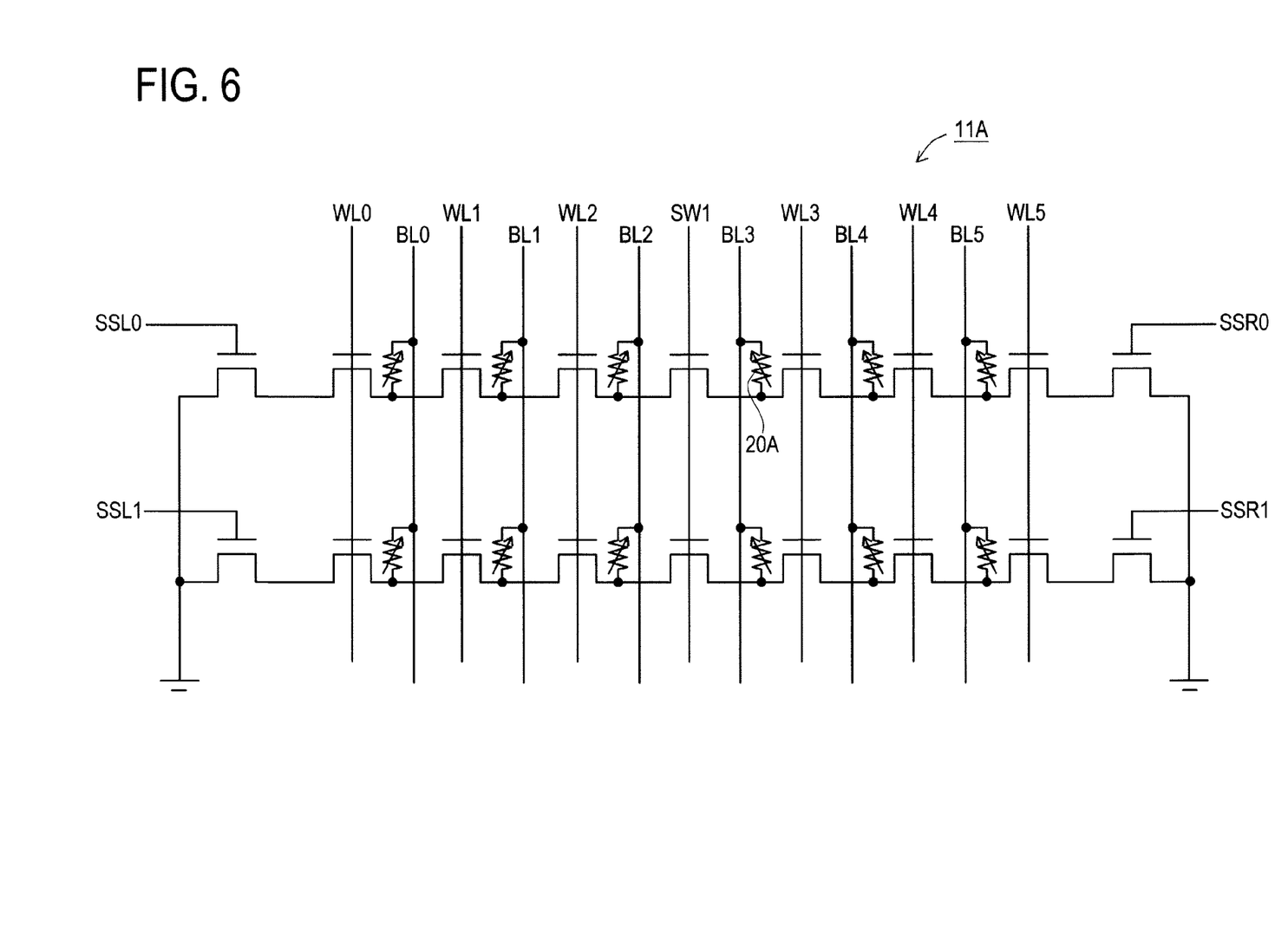
FIG. 6 is a circuit diagram showing the constitution of a memory cell array according to a second embodiment.

FIG. 6 is a circuit diagram showing the constitution of the memory cell array 11A. The memory cell array 11A comprises the source selector transistor connected at the gate thereof to a first source selector signal line SSL0, a second source selector signal line SSR0, a first source selector signal line SSL1 and a second source selector signal line SSR1, a plurality of cell selector transistors connected in series with each other and connected to the source selector transistor at both ends thereof, a switch 1 which connects a plurality of basic memory units with each other which are disposed substantially at the center of the plurality of cell selector transistors that are connected in series, and the variable resistor element which is provided as the memory element for storing bit information for each cell selector transistor and is connected at one end thereof to the drain terminal of the cell selector transistor and connected at the other end to the bit lines BL0 through BL5. The source selector transistor and the cell selector transistor connected provided between one end of the variable resistor element to be accessed and the first source selector signal line SSL0 and/or the second source selector signal line SSR0 or the first source selector signal line SSL1 and/or the second source selector signal line SSR1 are controlled to turn on (conduction state). The basic memory units are mirror-developed with the switch 1, which connects the plurality of basic memory units with each other disposed which are disposed substantially at the center of the plurality of cell selector transistor that are connected in series, as the basis.

The word lines WL0 through WL5 and the bit lines BL0 through BL5 which are connected to the gate terminals of the cell selector transistors are disposed to run parallel to each other. As a result, the word lines WL0 through WL5 are disposed at a predetermined pitch with a wiring interval permitted by the manufacturing process. In case the word lines WL0 through WL5 and the bit lines BL0 through BL5 are formed in different wiring layers, the restriction on the interval between the wiring lines can be mitigated or eliminated, so that the word lines and the bit lines can partially or entirely overlap each other in plan view, thus reducing the area required for wiring.

Figure 7:
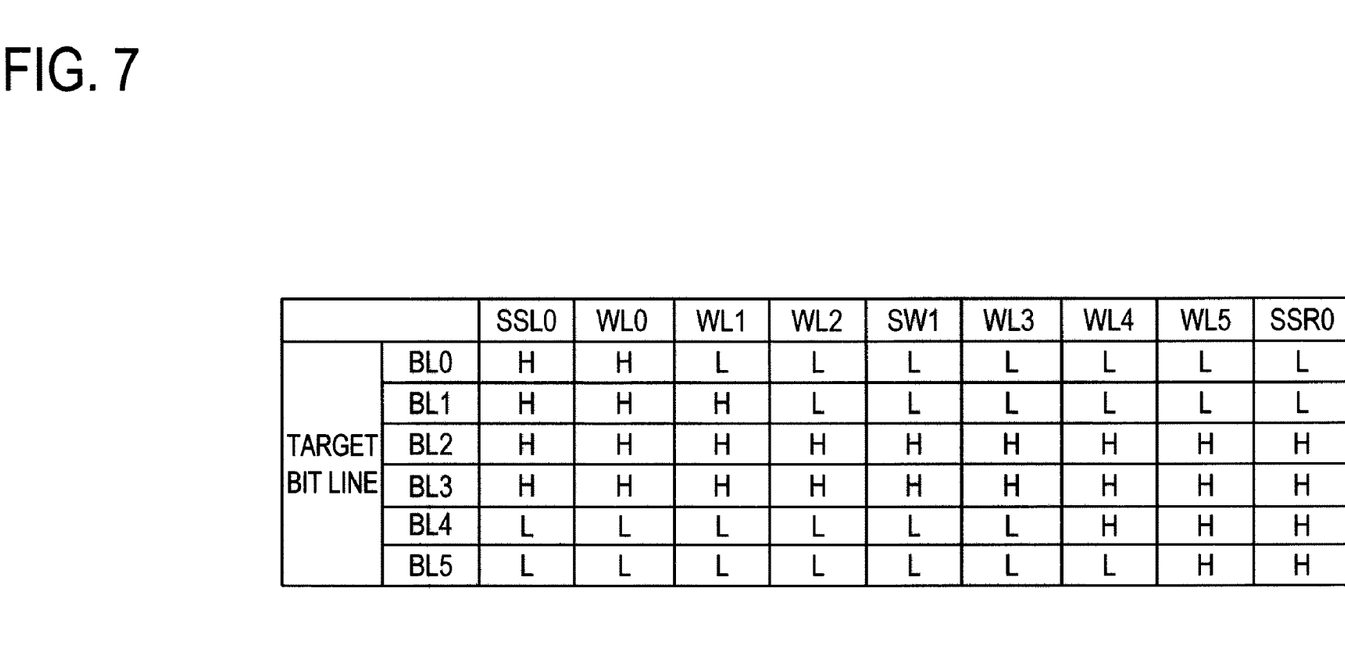
FIG. 7 is a table showing the states of the first source selector signal line SSL0, the second source selector signal line SSR0, the switch which connects the basic memory units with each other and the word lines WL0 through WL5 during access to the bit lines BL0 through BL5.

Operation of writing, deleting or reading data in or from the variable resistor element 20A (FIG. 6) will now be described. FIG. 7 shows a table of the states of the first source selector signal line SSL0, the second source selector signal line SSR0, the switch 1 which connects the plurality of basic memory units and the word lines WL0 through WL5 during access to the bit lines BL0 through BL5. When writing data to the variable resistor element 20A, the control circuit 12A which has received the write command causes the column decoder to select a particular bit line according to the address signal which has been input. At this time, other bit lines which are not selected are put in floating state. In addition, a signal is sent to the word line decoder for selecting a particular word line, so that the word line decoder selects a particular word line according to the signal. Specifically, the word lines WL0 through WL5 are selected in order to select the variable resistor element 20A. The switch 1 which connects the plurality of basic memory units with each other is also selected. The voltage generating circuit 13 applies a positive write voltage to the word line driver 15 and the bit line driver 17, so that the bit line BL3 which is selected is charged with the write voltage. In addition, the first source line decoder 18A and the second source line decoder 18B raise the first source selector signal line SSL0 and the second source selector signal line SSR0 which are selected to high level according to the address signal which has been input, pull the drain of the source selector transistor down to the ground potential, puts the first source selector signal line SSL1 and the second source selector signal line SSR1 which are not selected to low level and brings the drain of the source selector transistor which is not selected to floating state.

When deleting data stored in the variable resistor element 20A, the control circuit 12 which has received the delete command causes the column decoder 19 and the word line decoder 16A to select the bit line BL3 and the word lines WL0 through WL5 according to the address signal which has been input, similarly to the writing operation. The switch 1 which connects the plurality of basic memory units with each other is also selected. The voltage generating circuit 13 applies a positive delete voltage to the word line driver 15, a negative delete voltage to the bit line driver 17 and a delete voltage to the bit line BL3 which is selected. In addition, the first source line decoder 18A and the second source line decoder 18B raise the first source selector signal line SSL0 and the second source selector signal line SSR0 which are selected to high level according to the address signal which has been input, pull the drain of the source selector transistor down to the ground potential, put the first source selector signal line SSL1 and the second source selector signal line SSR1 which are not selected to low level and bring the drain of the source selector transistor which is not selected to floating state.

When reading data stored in the variable resistor element 20A, the control circuit 12A which has received the read command causes the column decoder to select the bit line BL3 according to the address signal which has been input. In addition, a high-level signal is sent to the word line driver 15 so as to select the word lines WL0 through WL5, and the word line driver 15 selects the word lines WL0 through WL5 according to the signal. The switch 1 which connects the plurality of basic memory units with each other is also selected. The voltage generating circuit 13 applies a read voltage to the bit line driver 17, and the bit line driver 17 pre-charges the read voltage to the bit line BL3 which selected. The voltage generating circuit 13 also applies the read voltage to the word line driver 15. In addition, the first source line decoder 18A and the second source line decoder 18B raise the first source selector signal line SSL0 and the second source selector signal line SSR0 which are selected to high level according to the address signal which has been input, pull the drain of the source selector transistor down to the ground potential, put the first source selector signal line SSL1 and the second source selector signal line SSR1 which are not selected to low level and bring the drain of the source selector transistor which is not selected to floating state.

In the memory cells other than that disposed at near the center of the plurality of cell selector transistors that are connected in series (the memory cells connected to BL0, 1 and BL4, 5 in this example), the switch 1 which connects the plurality of basic memory units with each other is not active, so that the cell selector transistor and the source selector transistor disposed in a path having the lowest impedance between the variable resistor element to be accessed and the source line are controlled to turn on (conduction state).

As described in detail above, the semiconductor memory device 1A of the second embodiment has the source selector transistor and the switch 1, which connects the plurality of basic memory units with each other, that are connected at both ends of the plurality of cell selector transistors that are connected in series. This allows it to select the path having lower impedance from among two paths running from the variable resistor element to the source line.

Also, in the memory cells disposed near the center of the plurality of cell selector transistors that are connected in series (the memory cells connected to BL2 and BL3 in this example), all the source selector transistors disposed in the two paths running between the variable resistor element to be accessed and the source line, the switch 1 which connects the plurality of basic memory units with each other, and the cell selector transistor are controlled to turn on (conduction state). This makes it possible to decrease the impedance of the path of the plurality of cell selector transistors that are connected in series.

The switch 1 which connects the plurality of basic memory units with each other may be omitted. In this case, the basic memory unit of the word line WL2 and the basic memory unit of the word line WL3 are connected with each other. When the bit lines BL0 through BL5 shown in FIG. 7 are to be accessed, the states of the first source selector signal line SSL0, the second source selector signal line SSR0 and the word lines WL0 through WL5 are operated according to the table. This enables it to further make the size of the memory cell array smaller.

In the basic memory unit which does not include the variable resistor element to be accessed, too, the bit line and the word line are biased with respect to the variable resistor element located at a position that corresponds to the variable resistor element to be accessed. Since this variable resistor element is not the object of access, voltage stress must not be biased. In this case, it can be set out of access by turning off the corresponding source selector transistor.

In case the corresponding source selector transistor is turned on at the same time, the corresponding source line is biased with the same voltage as the voltage bias of the bit line, then the voltage stress will not be biased between the terminals of the variable resistor element. In this case, voltage bias of the corresponding source line may be the same potential as that of the bit line. In case bias is applied between the terminals of the variable resistor element, the voltage stress must be of such a level as the resistance of the variable resistor element does not change during rewriting, and the voltage bias must be of such a level as the bit information which is read from the object to be accessed would not be inverted during reading. In case the reading operation is carried out by means of reading current, the current flowing in the variable resistor element to be accessed should not exceed the margin of the reading current.

With reference to exemplary embodiments thereof, a nonvolatile memory device is disclosed. The nonvolatile memory device includes a source selector transistor connected at one end thereof to a source line, a plurality of cell selector transistors connected in series with each other and to the other end of said source selector transistor and a basic memory unit including a variable resistor element which is constituted as a memory element to store bit information and is provided for each of said cell selector transistors, being connected at one end thereof to the drain terminal of said cell selector transistor and connected at the other end thereof to the bit line. The source selector transistor and said cell selector transistor provided between one end of said variable resistor element to be accessed and said source line are controlled to turn on.

In one embodiment, the nonvolatile memory device achieves random access to a variable resistor element, which is the memory element, while improving the degree of integration with respect to the circuit layout of a memory cell array, by constituting the nonvolatile memory device comprising the variable resistor elements in the form of memory array of novel constitution different from the prior art.

The present invention is not limited to the embodiments described above, and it is understood that various improvements and modifications can be made without departing from the spirit and scope of the present invention. For example, while the first embodiment shows a case of using the N-type TFT for the cell selector transistor, the present invention can be applied also to a case where an NMOS transistor is used. Moreover, while the first embodiment and the second embodiment show a case of using the MIM for the variable resistor element, the present invention can be applied also to a case where a tunnel junction device, silicide switch or a rewritable phase transition material is used. The present invention can be applied also to a case where a compound semiconductor based on germanium or an element of group III or group IV of the periodical table is used for the variable resistor element. Furthermore, while only the source selector transistor and the cell selector transistor connected at both ends of the bit lines BL3, BL4 which are to be accessed are controlled to turn on (conduction state) in the second embodiment, the present invention is not limited to this scheme. In order to decrease the impedance to the variable resistor element, the source selector transistor and the cell selector transistor connected at both ends may be controlled to turn on (conduction state) within the range of the bit lines BL2 through BL5 or within the range of the bit lines BL0 through BL7.

The invention claimed is:

1. A nonvolatile memory device comprising:
   a source selector transistor connected at one end to a source line;
   a plurality of cell selector transistors connected in series with each other and to the other end of said source selector transistor; and
   a basic memory unit including a variable resistor element which is constituted as a memory element to store bit information and is provided for each of said cell selector transistors, being connected at one end to the drain terminal of said cell selector transistor and at the other end to the bit line,
   wherein said source selector transistor and said cell selector transistor which are provided between one end of said variable resistor element to be accessed and said source line are controlled to turn on.

2. The nonvolatile memory device according to claim 1, wherein the word line to the gate terminal of said cell selector transistor and said bit line are disposed to run parallel to each other.

3. The nonvolatile memory device according to claim 1, wherein said source selector transistor is connected to both ends of said plurality of cell selector transistors which are connected in series in said basic memory unit.

4. The nonvolatile memory device according to claim 3, wherein a switch which connects said basic memory units with each other is disposed substantially at the center of said plurality of cell selector transistors that are connected in series.

5. The nonvolatile memory device according to claim 3, wherein said basic memory units which are connected serially are disposed in mirror arrangement substantially at the center of said plurality of cell selector transistors that are connected in series.

6. The nonvolatile memory device according to claim 3, wherein a path involving smaller number of said cell selector transistors is selected from among two paths running from the variable resistor element to be accessed to said source line, and said cell selector transistor and said source selector transistor which are provided in said path are controlled to turn on.

7. The nonvolatile memory device according to claim 3, wherein all of said cell selector transistors and said source selector transistor provided in the two paths running from the variable resistor element to be accessed to said source line are controlled to turn on.

8. The nonvolatile memory device according to claim 1, wherein said basic memory units are provided in plurality to form a memory block, gate terminals of said cell selector transistors disposed at a corresponding position in each of said basic memory units are connected to a common word line in said memory block, and the other end of said variable resistor element disposed at a corresponding position in each of said basic memory units is connected to a common bit line in said memory block.

9. A memory system comprising:
   a control circuit;
   a source line decoder coupled to said control circuit;
   a column decoder coupled to said source line decoder; and
   a memory cell array coupled to said control circuit, wherein said memory array comprises a nonvolatile memory device comprising:
   a source selector transistor connected at one end thereof to a source line;
   a plurality of cell selector transistors connected in series with each other and to the other end of said source selector transistor; and
   a basic memory unit including a variable resistor element which is constituted as a memory element to store bit information and is provided for each of said cell selector transistors, being connected at one end thereof to the drain terminal of said cell selector transistor and connected at the other end thereof to the bit line,
   wherein said source selector transistor and said cell selector transistor which are provided between one end of said variable resistor element to be accessed and said source line are controlled to turn on.

10. The memory system according to claim 9, wherein the word line to the gate terminal of said cell selector transistor and said bit line are disposed to run parallel to each other.

11. The memory system according to claim 9, wherein said source selector transistor is connected to both ends of said plurality of cell selector transistors which are connected in series in said basic memory unit.

12. The memory system according to claim 11, wherein a switch which connects said basic memory units with each other is disposed substantially at the center of said plurality of cell selector transistors that are connected in series.

13. The memory system according to claim 11, wherein said basic memory units which are connected successively are disposed in mirror arrangement substantially at the center of said plurality of cell selector transistors that are connected in series.

14. The memory system according to claim 11, wherein a path involving smaller number of said cell selector transistors is selected from among two paths running from the variable resistor element to be accessed to said source line, and said cell selector transistor and source selector transistor provided in said path are controlled to turn on.

15. The memory system according to claim 11, wherein all of said cell selector transistors and said source selector transistor provided in the two paths running from the variable resistor element to be accessed to said source line are controlled to turn on.

16. The memory system according to claim 9, wherein said basic memory units are provided in plurality to form a memory block, gate terminals of said cell selector transistors disposed at a corresponding position in each of said basic memory units are connected to a common word line in said memory block, and the other end of said variable resistor element disposed at a corresponding position in each of said basic memory units is connected to a common bit line in said memory block.

17. The memory system according to claim 9, wherein said control circuit receives control signal, address signal and data inputs and controls said column decoder and said source line decoder.

18. A method for controlling a nonvolatile memory device comprising a source selector transistor connected at one end thereof to a source line, a plurality of cell selector transistors connected in series with each other and to the other end of said source selector transistor, and variable resistor element which is a memory element to store bit information provided for each of said cell selector transistors and is connected at one end thereof to the drain terminal of said cell selector transistor and connected at the other end thereof to the bit line, said method comprising the steps of:
   causing said source selector transistor and said cell selector transistor, which are provided between one end of said variable resistor element to be accessed and said source line, to turn on; and
   biasing a voltage stress between said bit line, to which said variable resistor element to be accessed and said source line is connected, and said source line.

19. The method for controlling the nonvolatile memory device according to claim 18, wherein in case said source selector transistor is connected to both ends of said plurality of cell selector transistors which are connected in series with each other, said source selector transistor and said cell selector transistor located on a path involving a smaller number of said cell selector transistors, among two paths running from said variable resistor element to be accessed to said source line, are turned on.

20. The method for controlling the nonvolatile memory device according to claim 18, wherein in case said source selector transistor is connected to both ends of said plurality of cell selector transistors which are connected in series with each other, all of said source selector transistors and said cell selector transistors, which are located on the two paths from said variable resistor element to be accessed to said source line, are turned on.

* * * * *